(12) United States Patent
Antolik

(10) Patent No.: US 11,127,610 B2
(45) Date of Patent: Sep. 21, 2021

(54) SPLIT CHAMBER ASSEMBLY

(71) Applicant: Lam Research Corporation, Fremont, CA (US)

(72) Inventor: Jerrel Kent Antolik, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 212 days.

(21) Appl. No.: 16/240,195

(22) Filed: Jan. 4, 2019

(65) Prior Publication Data
US 2020/0219738 A1 Jul. 9, 2020

(51) Int. Cl.
*H01L 21/67* (2006.01)
*H01L 21/687* (2006.01)
*H01J 37/32* (2006.01)

(52) U.S. Cl.
CPC .... *H01L 21/6719* (2013.01); *H01J 37/32568* (2013.01); *H01J 37/32899* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 2003/0196760 A1* | 10/2003 | Tyler | H01J 37/32422 156/345.47 |
| 2009/0047433 A1 | 2/2009 | Kim et al. | |
| 2013/0126092 A1* | 5/2013 | Sexton | H01J 37/32807 156/345.1 |
| 2018/0294173 A1* | 10/2018 | Suh | H01J 37/32715 |

FOREIGN PATENT DOCUMENTS

| | | |
|---|---|---|
| KR | 100918036 B1 | 9/2009 |
| KR | 1020120134366 A | 12/2012 |
| KR | 1020150141226 A | 12/2015 |

OTHER PUBLICATIONS

Notification of Transmittal of the International Search Report and the Written Opinion of the International Searching Authority, PCT/US2019/063795, dated Mar. 23, 2020.

* cited by examiner

*Primary Examiner* — Karla A Moore
(74) *Attorney, Agent, or Firm* — Penilla IP, APC

(57) ABSTRACT

A process module including a chamber body having a lower chamber and an upper chamber is provided. The lower chamber is configured to mate with the upper chamber along a diagonal interface. An electrode assembly having a substrate support is provided. The electrode assembly is coupled to the upper chamber. A hinge connect couples a first side of the lower chamber to a first side of the upper chamber. The upper chamber is configured to split and open along the diagonal interface and rotate about the hinge connect. The electrode assembly is configured to rotate with the upper chamber in a direction that is away from the lower chamber.

13 Claims, 7 Drawing Sheets

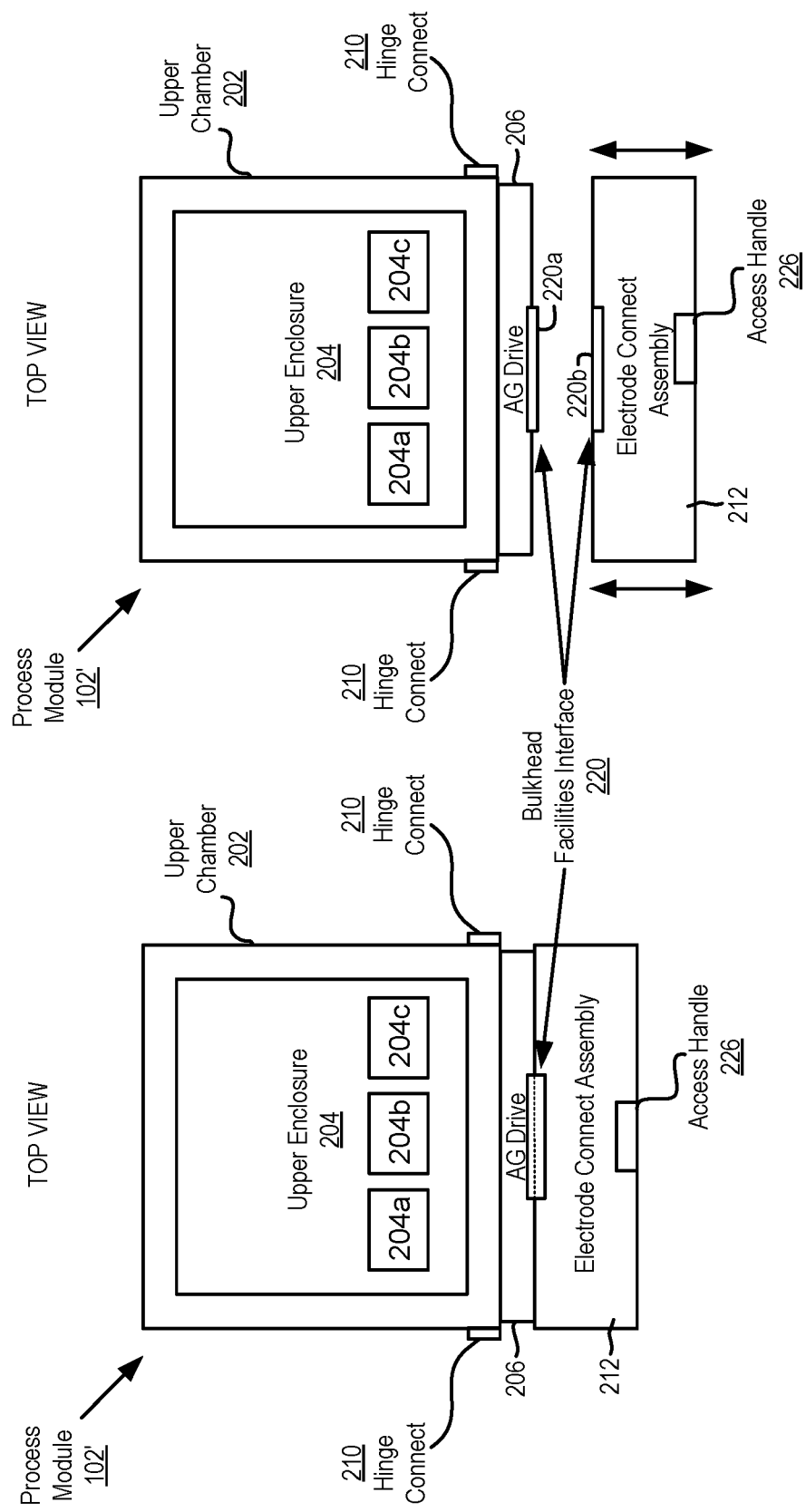

1) CENTER OPEN CONFIGURATION SHOWN

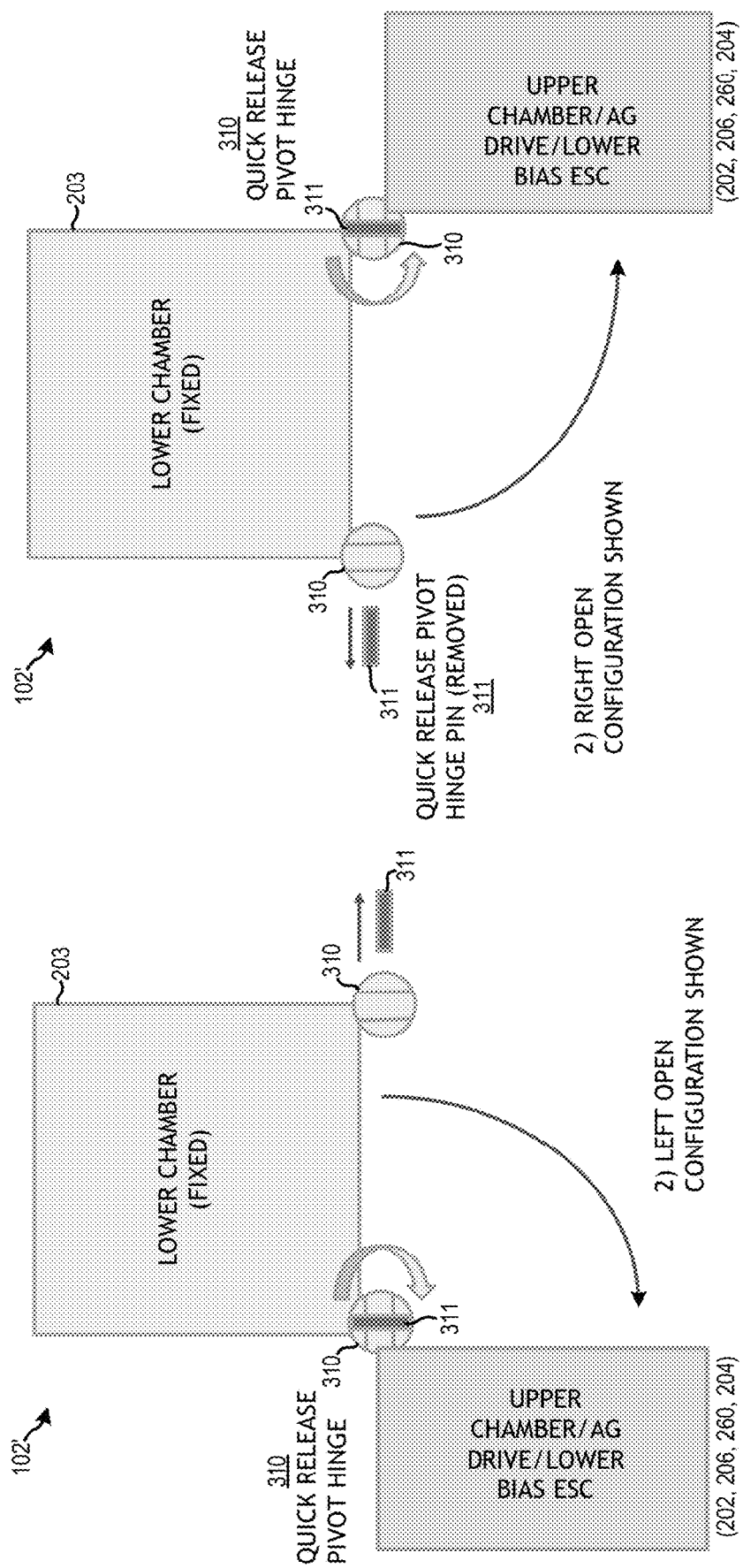

SPLIT CHAMBER ASSEMBLY

FIELD OF THE DISCLOSURE

The present embodiments relate to semiconductor wafer processing equipment, and more particularly, to process modules structured to enable ease of access for servicing.

DESCRIPTION OF THE RELATED ART

In a semiconductor fabrication facility (commonly referred to as a "fab") space is limited and expensive, and cannot be readily increased. Therefore, efficient space utilization is desired in order to achieve maximum productivity. However, it is also necessary to provide adequate access to equipment in the fab for maintenance and service. By way of example, newer fabrication facilities have begun cluster process modules in closer orientations. Although clustering tools increases floor space utilization and in some cases throughput, these configurations also reduce access to service or access inside areas of the process module. To gain access for such servicing, fab technicians are forced to squeeze into tight spaces to access process modules or simply disassemble parts of the cluster tool in order to compete service. Although this is possible, disassembly takes time and can significantly reduce throughput or even downtime for a whole cluster tool.

It is in this context that embodiments of the inventions arise.

SUMMARY

Implementations of the disclosure provide a split chamber assembly where a chamber body includes a lower chamber and an upper chamber. In one embodiment, the chamber body is for a process module used in the fabrication of semiconductor substrates. In one configuration, the split between the upper chamber and the lower chamber is along a diagonal interface. The diagonal interface enables pivoting of the upper chamber away from the lower chamber to expose an inner region of the lower chamber for servicing or cleaning. In one configuration, the upper chamber includes a connected lower electrode assembly, such that removal of the upper chamber also removes the lower electrode assembly. In another embodiment, the upper chamber further includes an upper enclosure that houses an upper electrode and showerhead. In this configuration, removal of the upper chamber also removes the upper enclosure, so that removal of the upper chamber maintains alignment of the upper electrode to the lower electrode. In a further configuration, removal of the upper chamber is facilitated by hinge connects that enable rotation of the upper chamber off of the lower chamber. Rotating the upper chamber off of the lower chamber splits the upper chamber from the lower chamber along the diagonal interface. In still another embodiment, kinematic pins are used to mate and self-align the upper chamber with the lower chamber to maintain precise alignment when the upper chamber mates with the lower chamber. In yet another embodiment, the hinge connects include individual hinge pins. The individual hinge pins are removable to enable a second rotation of the upper chamber away from the lower chamber.

In one embodiment, the second rotation enables either a left swing open of the upper chamber or a right swing open of the upper chamber. The chamber body is therefore configured to split diagonally relative to a wafer plane. This will allow a lower bias assembly and a top plate assembly to be hinged open exposing the lower chamber, which in one embodiment remains fixed. In one embodiment, the hinges have quick release pins and an adjustable thrust bearing to enable an opened top end to be swung open either left or right. In one configuration, adjustable kinematic pins or landing locations will allow the upper chamber to re-attach to the lower chamber in alignment, which can be pre-calibrated. Further, once the upper chamber is opened by a first rotation that splits the upper chamber away from the lower chamber or a second rotation that swings the upper chamber about a hinge connect; the inner region of the lower electrode can be serviced with greater access room. As a further benefit of the split chamber assembly is access and servicing when multiple chambers are aligned together in a cluster configuration.

In one embodiment, a process module including a chamber body having a lower chamber and an upper chamber is provided. The lower chamber is configured to mate with the upper chamber along a diagonal interface. An electrode assembly having a substrate support is provided. The electrode assembly is coupled to the upper chamber. A hinge connect couples a first side of the lower chamber to a first side of the upper chamber. The upper chamber is configured to split and open along the diagonal interface and rotate about the hinge connect. The electrode assembly is configured to rotate with the upper chamber in a direction that is away from the lower chamber.

In another embodiment, a method for accessing a process module is provided. The method includes providing a lower chamber having a first diagonal interface along a first cross-section of said lower chamber. The first cross-section having an upper wall side and a lower wall side, so that the first diagonal interface is established along an angle. The method further includes providing an upper chamber having a second diagonal interface along a second cross-section of said upper chamber. The second cross-section provides a lower wall side that mates proximate to the lower wall side of the lower chamber and an upper wall side that mates proximate to the upper wall side of the lower chamber. The second diagonal interface is configured to mate with the first diagonal interface along the angle. The method includes pivoting the upper chamber at a pair of pivot hinges proximate to the lower wall side of the upper chamber and the lower chamber. The pivoting enables the upper chamber to split and separate from the lower chamber along the first and second diagonal interfaces to expose an inner region of the lower chamber without having the upper chamber over the lower chamber.

BRIEF DESCRIPTION OF THE DRAWINGS

FIGS. 2A and 2B illustrates a top view of a process module having a split chamber assembly configuration, in accordance with one embodiment.

FIGS. 7A and 7B illustrate a swing rotation of the upper chamber, in accordance with one embodiment.

DESCRIPTION

Implementations of the disclosure provide a split chamber assembly where a chamber body includes a lower chamber and an upper chamber. In one configuration, the upper chamber and the lower chamber are split along a diagonal interface, relative to a horizontal plane of a substrate support. A diagonal interface enables pivoting of the upper chamber away from the lower chamber to open access to an inner region of the lower chamber for servicing or cleaning. In one embodiment, the upper chamber includes a connected lower electrode assembly, such that removal of the upper chamber also removes the lower electrode assembly. In this embodiment, the upper chamber is connected with an upper enclosure that houses an upper electrode and showerhead. Removal of the upper chamber also removes the upper enclosure, so that removal of the upper chamber maintains alignment of the upper electrode to the lower electrode. In a further configuration, removal of the upper chamber is facilitated by hinge connects that enable rotation of the upper chamber off of the lower chamber. The hinge connects also enable swinging open of the upper chamber by removal of one of the hinges. These and other embodiments will be described below in more detail. It should be appreciated that the present embodiments can be implemented in numerous ways, such as a process, an apparatus, a system, a device, a material, or a method. Several embodiments are described below.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably.

Figure 1:
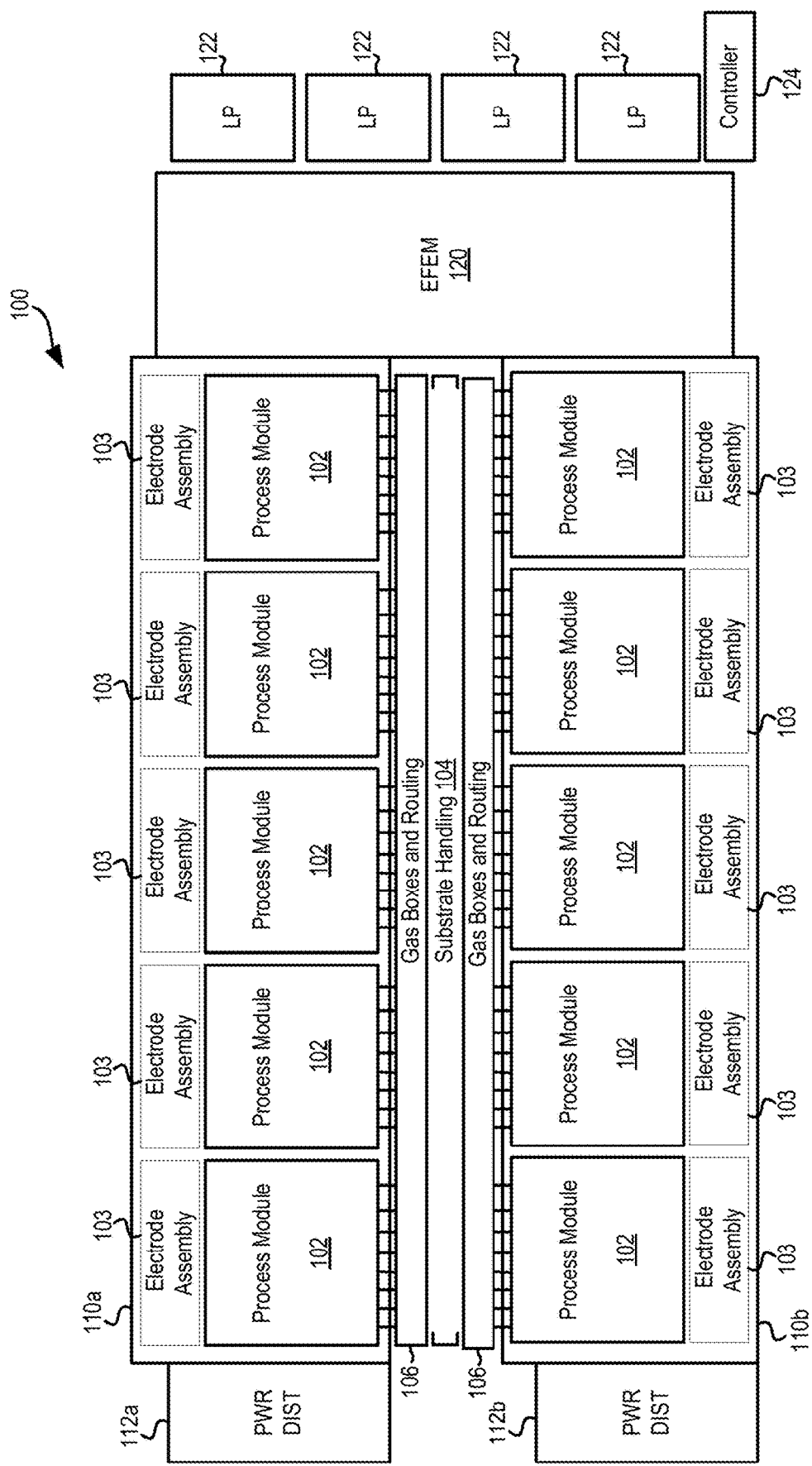
FIG. 1 shows a cluster tool that includes a plurality of process modules, in accordance with one embodiment.

FIG. 1 shows a cluster tool 100 that includes a plurality of process modules 102, in accordance with one embodiment. As shown, the process modules 102 are arranged in a linear configuration, such that they are side-by-side. In one embodiment, the cluster tool 100 includes two rows of process modules 102. On one side of the cluster tool 100 is an equipment front and module (EFEM) 120 that is interfaced with load ports 122. A controller 124 is interfaced with the components of the cluster tool 100, including the process modules 102 for managing and controlling the processing of substrates within the cluster tool 100. As shown, the center region of the cluster tool 100 includes a substrate handling 104 region, which can include a robot (not shown) that delivers and removes substrates from the processing modules 102, and interfaces with the EFEM 120. Gas boxes and routing 106 are coupled to the various process modules 102, which deliver the processing gases needed to perform processing recipes for etching, deposition, and other recipe steps.

A power distribution module 112a and power distribution module 112b are shown connected to each of the legs of the cluster tool 100. Each of the process modules 102 is coupled to respective RF generators that provide RF power to the processing chambers of the process modules 102. The gas boxes and routing 106 deliver the process gases to enable the processing in accordance with the recipes. An electrode assembly 103 is shown coupled to each process module 102. The electrode assembly 103 includes a lower bias electrode assembly, which is interfaced into the process modules 102. The electrode assembly 103 can also include other facility connections, such as helium delivery, electrostatic chuck cooling connections (e.g. helium delivery), temperature controllers, pneumatics, optical sensors, and the like.

Traditionally, in order to service an internal region of the process module 102, the electrode assembly 103 must be removed. Additionally, an upper enclosure that houses an upper electrode, showerhead, and other facilities would have to be lifted up and removed in order to view into the chamber of the process module 102. However, since the process modules 102 are closely arranged in the linear format shown in FIG. 1, access to view inside of the chamber or service the chamber can be very constrained or difficult. It is in this context that a split chamber assembly is provided, to modify the chamber body of the process module 102. The split chamber assembly for the process module 102 is described in more detail with reference to FIGS. 2A through 7B. It should be understood that the cluster tool 100, and it's linear configuration will also be able to utilize the split chamber assembly described below, but provide more efficiencies for servicing the inside of the chamber and/or replacement of process module 102 components.

FIG. 2A illustrates a top view of a process module 102' that has a split chamber assembly configuration, in accordance with one embodiment. The process module 102' has an upper enclosure 204 that is coupled to a top surface of the upper chamber 202. The upper enclosure 204 includes an upper electrode 204a, the showerhead 204b, a gas distribution plate (GDP) 204c, and other facilities for enabling delivery of power or connections to ground for the upper electrode 204a. The upper enclosure 204 is connected to gas boxes and routing, which provide process gases used for processing semiconductor substrates within the process module 102'. Also shown is electrode connected assembly 212, which couples to an adjustment gap (AG) drive 206. The AG drive 206 is an adjustable gap interface that is used to move the lower electrode up or down when the lower electrode is installed in the process module 102'.

In one embodiment, a bulkhead facilities interfaced 220 is used to connect to a lower electrode 260 (shown in FIG. 3A), to the AG drive 206 and interface it to the electrode connected assembly 212. An access handle 226 is used to provide quick connect of the electrode connected assembly 212 to the AG drive 206. The access handle 226 will allow connection or separation of the lower electrode 260 from the electrode connected assembly 212. As will be described below, the electrode connected assembly will include a radio frequency (RF) match 230, and connections for an RF rod, electrostatic chuck (ESC) cooling, power, thermocouple sensors, pneumatics, and optical sensors.

As shown in FIG. 2B, the electrode connected assembly 212 is configured to be released from the AG drive 206 once the access handle 226 has been activated to remove and disconnect the facilities provided by the electrode connected assembly 212. As shown, the electric connected assembly 212 has been pulled back, separating the bulkhead facilities interfaced 220 into bulkhead breaks 220a and 220b. In one embodiment, in a fabrication facility, the electrode connected assembly 212 can be wheeled back by an operator, after the access handle 226 has been activated to release the facilities connections within the bulkhead facilities interfaced 220, and exposing the bulkhead breaks 220a and 220b.

Figures 3A, 3B:
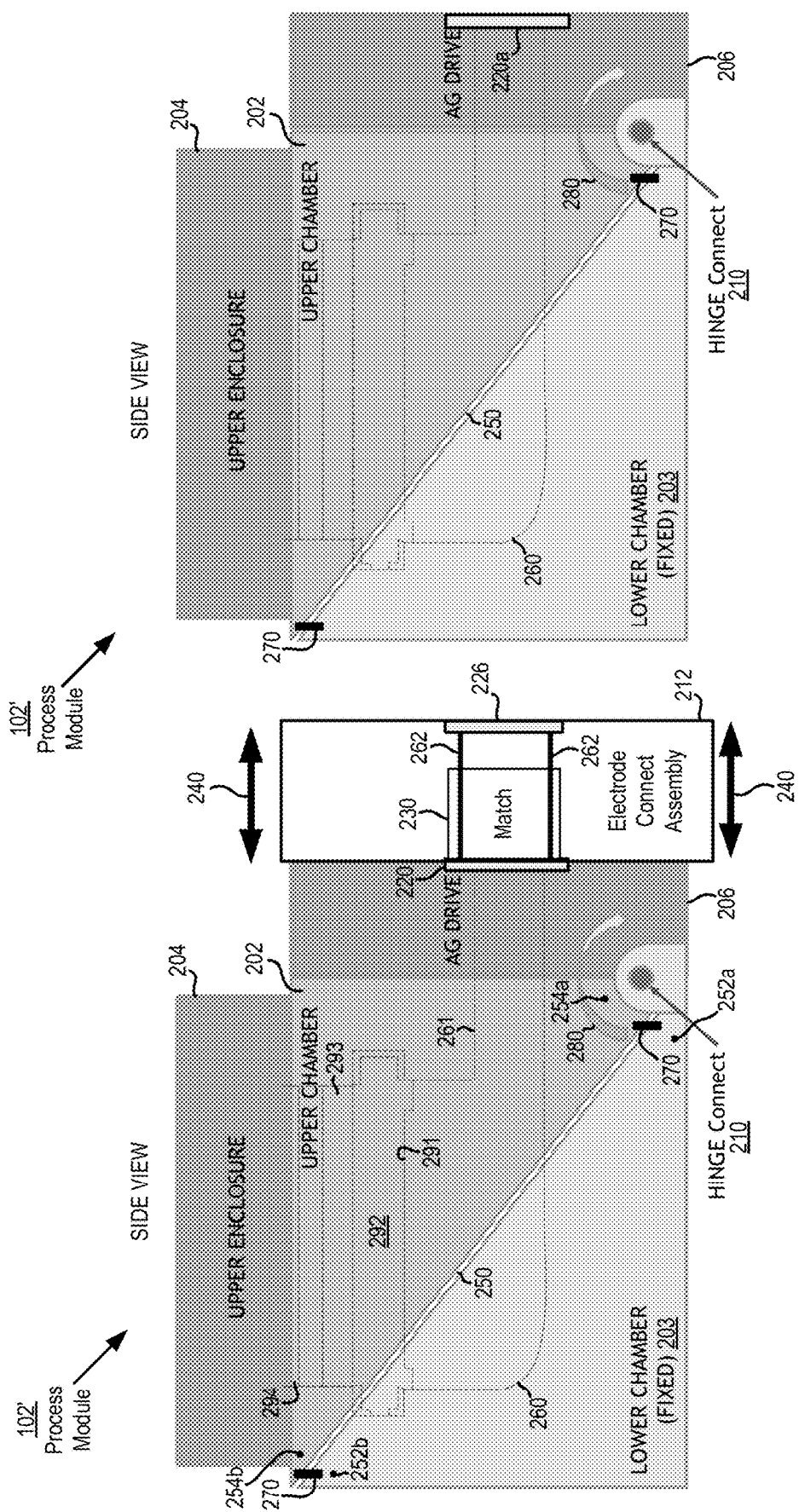
FIGS. 3A and 3B illustrates a side view of a split chamber assembly for a process module, in accordance with one embodiment.

Also shown are hinge connects 210, which are used to enable rotation of the upper chamber 220 relative to the lower chamber 203, as shown in FIG. 3A. The hinge connect 210 is illustrated to be adjacent to the AG drive 206, so that a pivot point is provided to enable the upper chamber 202 to rotate along with the AG drive 206 and the upper enclosure to expose an interior region of the lower chamber 203. Once the lower chamber 203 has been exposed, servicing of the interior of the lower chamber 203 can occur. As described above, the servicing can include a clean of the lower chamber interior, cleaning of a liner, or removal and replacement of the liner with a clean liner. Other servicing operations can also occur to the upper chamber 202 and its components once removed from the lower chamber 203.

FIG. 3A illustrates a side view of a split chamber assembly for the process module 102', in accordance with one embodiment. As shown, the lower chamber 203 is fixed relative to the upper chamber 202. In one configuration, the lower chamber 203 is fixed to a frame of the cluster tool 100 as shown in FIG. 1. A hinge connect 210 is shown coupling the lower chamber 203 to the upper chamber 202. The AG drive 206, the upper chamber 202, and the upper enclosure 204 are coupled together, and are configured to rotate together when the upper chamber 202 separates from the lower chamber 203 along the diagonal interface 250. As shown, an electrode assembly 260 is contained within the process module 202', and the electrode assembly 260 is connected to the AG drive 206 and the upper enclosure 204.

Figure 4:
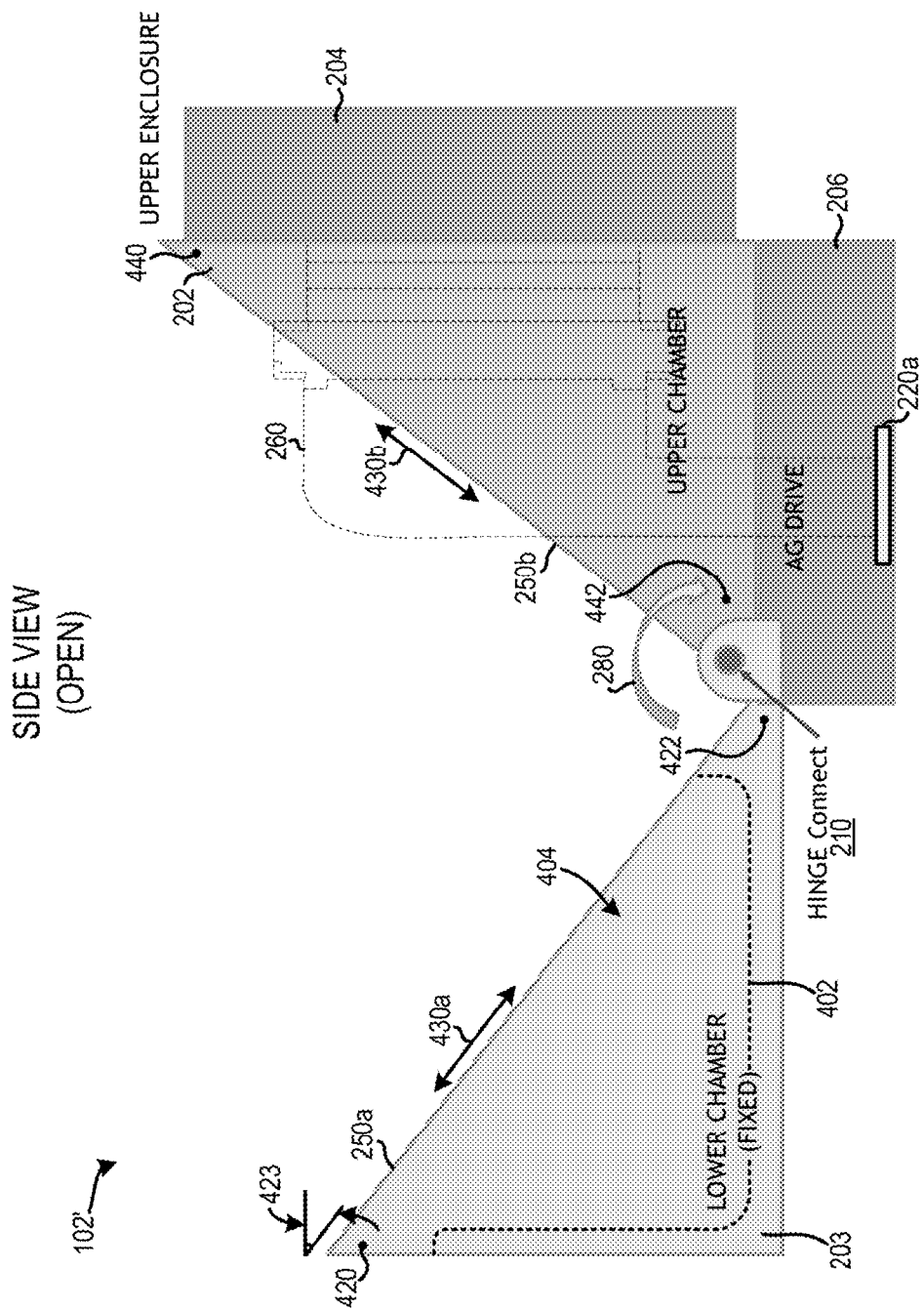
FIG. 4 illustrates the process module, where the chamber body is defined by the lower chamber, and the upper chamber is open for serving, repair, or assembly.

In this chamber configuration, the electrode assembly 260 includes a substrate support 291, a showerhead 293, the gas distribution plate (GDP) 294, and an RF transmission rod 261. A process region 292 is defined between the showerhead 293 and the substrate support 291. In one embodiment, the calibration between the showerhead 293, which operates as the upper electrode, and the substrate support to anyone can be fixed for the desired tolerances. Once the calibration is complete, the separation will remain fixed when the process module 102' is opened along the diagonal interface 250. The separation is fixed because the electrode assembly 260 along with the upper enclosure 204 and AG drive 206 will move together when the upper chamber 202 is separated from the lower chamber 203 (as shown in FIG. 4).

Further shown is the electrode connected assembly 212, which includes a radio frequency (RF) match 230. Connection mechanism 262 is shown coupled between the access handle 226 and the bulkhead facilities interfaced 220. The connection mechanism 262 is configured to activate the connection and disconnection of all facilities between the electrode connected assembly 212 and the AG drive 206. These connections include connections to the RF transmission rod 261, connections for electrostatic chuck (ESC) cooling, helium connections, power connections, thermocouple sensor connections, pneumatics connections, optical sensors connections, and other facilities for operating the process module 102'.

As further shown in FIG. 3A, the lower chamber 203 will have an angled surface that defines the diagonal interface 250. The wall of the lower chamber 203 will have a first side 252a adjacent to and connected with the hinge connect 210, and a second side 252b that is opposite the hinge connect 210. In this configuration, the first side 252a is a shorter side, while the second side 254b is a longer side, and the diagonal interface extends between the first side 252a and the second side 252b. The upper chamber will correspondingly have a first side 254a that is proximate to and connected to the hinge connect 210, and a second side 254b that is opposite in a diagonal from the hinge connect 210. The corresponding first sides 252a and 254a and the corresponding second sides 252b and 254b are configured to mate along the diagonal interface 250. The diagonal interface 250 is therefore shown to extend upward at an angle from the hinge connect 210 to the opposite top region of the upper chamber 202.

FIG. 3B illustrates the process module 102' after the electrode connected assembly 212 has been removed in the direction 240, leaving the electrode assembly 260 connected to the bulkhead break 220a of the AG drive 206. As shown, once the electrode connected assembly 212 has been removed, the upper enclosure 204 will remain disposed over and connected to the upper chamber 202, along with the AG drive 206. Therefore, the upper chamber 202 when rotated about a hinge connect 210, will cause the similar rotation of the upper enclosure 204 and the AG drive 206 away from the diagonal interface 250. As shown, kinematic pins 270 are provided for interfacing and aligning the upper chamber 202 with the lower chamber 206. In this manner, surfaces that interface between the lower chamber 203 and the upper chamber 204 can meet in an aligned manner, maintaining efficient closing an opening of the split chamber assembly of the process module 102'. In this embodiment, the rotation is clock-wise, when opened about the hinge connect 210.

In a first alternative embodiment, the hinge connect 210 may located on an opposite side of the process module 102. By way of example, the hinge connect 210 may be located at the diagonal opposite side, e.g., at the second side 254b, as shown in FIG. 3A. In this first alternative embodiment, the upper chamber 202, the upper enclosure 204 and the AG drive 206 would lift up and rotate counter-clockwise about hinge connects 210. In a second alternative embodiment, the upper chamber 202, the upper enclosure 204 and the AG drive 206 could be lifted up off of the lower chamber 203. In this second alternative embodiment, Kinematic pins 270 would be present, but a separate lifting mechanism could be used to raise the upper chamber up, and then out, instead of rotating the assemblies.

FIG. 4 illustrates the process module 102', where the chamber body defined by the lower chamber 203 and the upper chamber 202 is open in a split configuration. The split configuration is shown to expose a first cross section 430a of the lower chamber 203 and a second cross-section 430b of the upper chamber 202. The first and second cross-sections are complementary to each other, and defined the diagonal interface 250a of the lower chamber and the diagonal interface 250b of the upper chamber. When the upper chamber 202 is open and pivoted for rotation about hinge connect 210, the upper enclosure 204, the AG drive 206, and the electrode assembly 260 move away from the lower chamber 203, which remains fixed. At this point, it is possible to service an interior region of the lower chamber 203. As mentioned above, surfacing of the lower chamber 203 can include cleaning the chamber interior, cleaning a liner 402, or removing and inserting a new liner 402.

In this configuration open configuration, the upper chamber 202 is no longer present over the lower chamber 203, since it has pivoted away from the lower chamber 203 during the rotation about the hinge connect 210. As shown above, hinge connect 210 is located at a lower sidewall 422 of the lower chamber 203 and also coupled to the lower wall side 442 of the upper chamber 202. In this manner, the upper wall side 420 of the lower chamber 203 will separate from the upper wall side 440 of the upper chamber 202. The diagonal interface 250 will therefore have an angle 423, which define the diagonal interface 250a of the lower chamber 203 and diagonal interface 250b of the upper chamber 202. In a region 404 of the lower chamber remains exposed for servicing upon having the upper chamber 202 removed by rotation about the hinge connect 210.

Figures 5, 6:
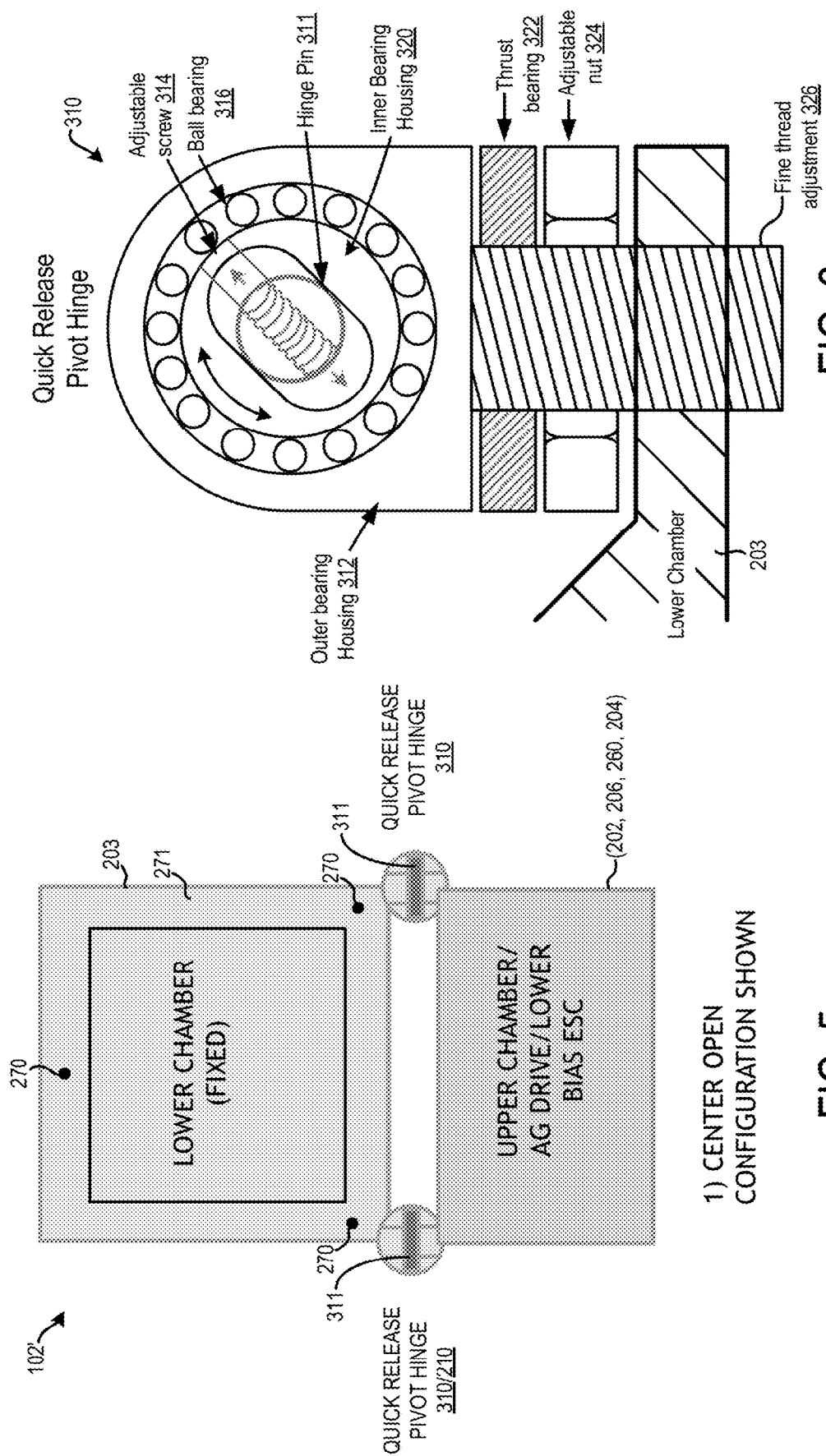
FIG. 5 illustrates a top view of the split chamber assembly when the upper chamber has been opened, and rotated about the hinge connect, in accordance with one embodiment.
FIG. 6 illustrates one example of a quick release pivot hinge, in accordance with one embodiment.

FIG. 5 illustrates a top view of the split chamber assembly when the upper chamber 202 has been opened, and rotated about the hinge connect 210. In the embodiment of FIG. 5, a quick release pivot hinge 310 is utilized to enable the first rotation of the upper chamber 202 away from the lower chamber 203. When the upper chamber 202 is separated from the lower chamber 203, the interior of the lower chamber 203 can be accessed for servicing. This configuration also shows a contact surface 271, over which the upper chamber 202 will sit and where gaskets will be placed to enable a seal between the chambers. Further shown are the kinematic pins 270, which provide for the accurate alignment of the upper chamber 202 with the lower chamber 203 when they are in the mating configuration and operational.

In one embodiment, two quick release pivot hinges 310 are provided for connecting the upper chamber 202 with the lower chamber 203. The quick release pivot hinges 310 include a hinge pin that may be removed in order to provide additional rotation of the open upper chamber 202 along with the AG drive 206, the lower electrode 260, and the upper enclosure 204. This additional swinging rotation is shown with reference to FIGS. 7A and 7B.

In FIG. 6, a quick release pivot hinge 310 is shown, as one example type of hinging mechanism. It should be understood that the exact hinging mechanism may be modified so long as the first rotation of the upper chamber 202 is provided and also the ability to remove a hinge pin 311 for providing an additional swinging rotation. With this in mind, the quick release hinge pin 310 may include an outer bearing housing 312 that surrounds ball bearings 316. An adjustable screw 314 is provided for adjustably calibrating the positioning of the upper chamber 202 for closure over the lower chamber 203. An inner bearing housing 320 is also provided to enable the second rotation for the swinging motion described below. Hinge pin 311 is also shown, and may be removed for allowing swinging about one of the quick release hinges 310. In one embodiment, both quick release pivot hinges 310 can have their pins removed if the upper chamber 202 and its associated assemblies need to be replaced with another assembly. Continuing with FIG. 6, a thrust bearing 322 is shown coupled to an adjustable nut 324. A fine threaded adjustment 326 may also be provided to provide height adjustments relative to the lower chamber 203.

As such, the quick release hinge 310 will provide for two types of rotation once it is calibrated with its various adjustments relative to the lower chamber 203 and the upper chamber 202. It should be understood that the first type of rotation provided by the quick release pivot hinge 310 is when both hinge pins 311 are inserted in the quick release pivot hinge 310. This first type of rotation will allow separation between the upper chamber 202 and the lower chamber 203. The second type of rotation will be when one of the quick release pivot hinges 310 has its hinge pin removed to allow swinging of the upper chamber 202 and its associated assemblies in a left configuration or a right configuration, depending on which hinge pin is removed.

FIG. 7A illustrates an example of hinge pin 311 removed from quick release pivot hinge 310 at a right corner of the lower chamber 203. Removal of hinge pin 311 will therefore enable swinging of the upper chamber 202 along with the AG drive 206, electrode assembly 260, and the upper enclosure 204 to the left. FIG. 7B illustrates the alternate swinging mode, which allows second rotation to the right of the upper chamber 202 and its associated assemblies. As mentioned above, it is also possible to remove hinge pin 311 from both quick release hinges 310, to allow the upper chamber 202, AG drive 206, electrode assembly 260, and upper enclosure 204 to be completely removed and replaced with a new or serviced corresponding assembly. As can be appreciated, such quick removal will allow for quicker servicing of a cluster tool assembly 100, and will further allow for a denser configuration of process modules 202'. The denser configuration is beneficial for reducing the footprint of the cluster tool 100, and reduces clean room space for fabrication of semiconductor substrates in an efficient manner.

Figure 8:
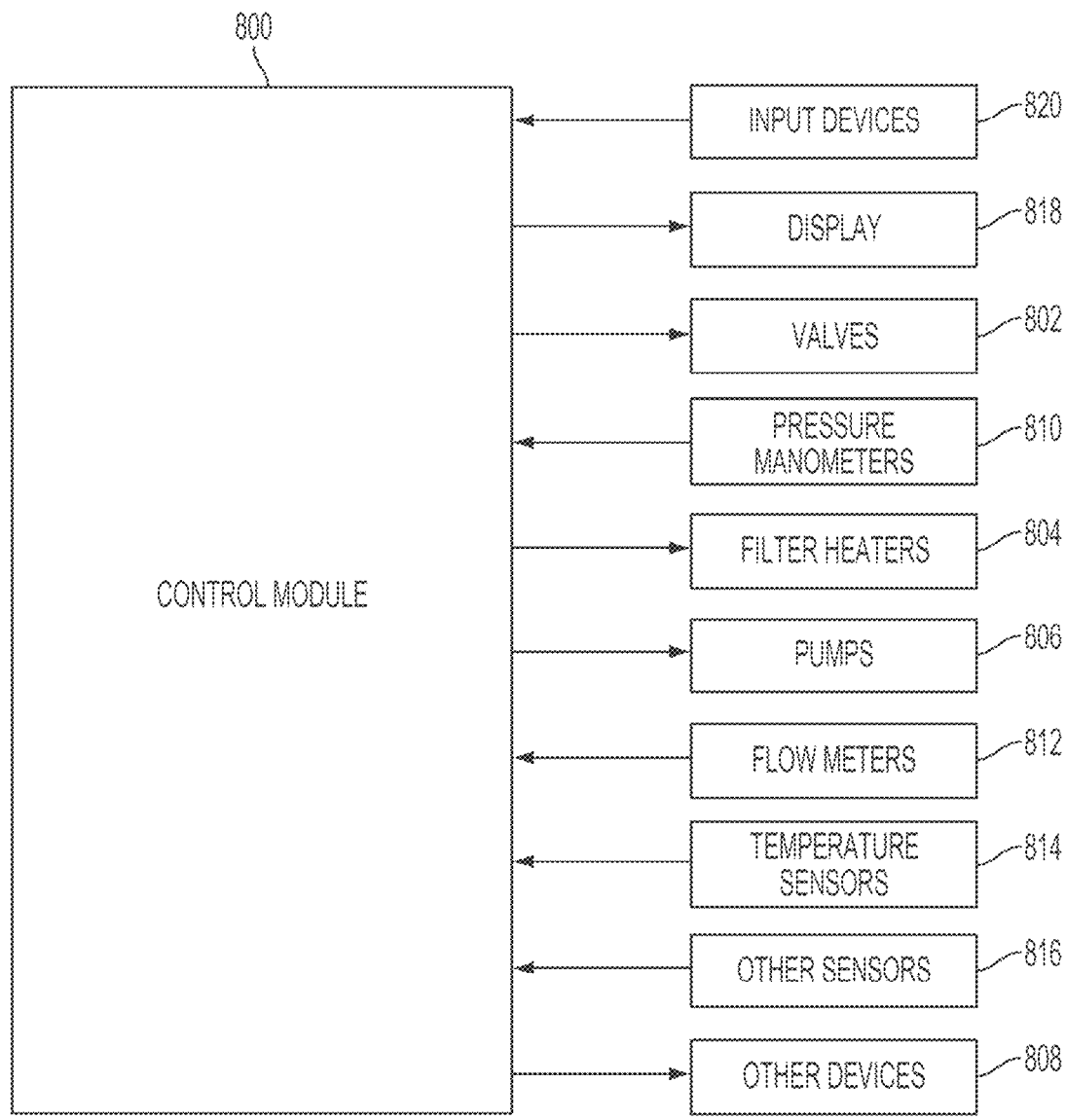
FIG. 8 shows a control module for controlling the systems of the present disclosure.

FIG. 8 shows a control module 800 for controlling the systems described above. For example, any of the movements of the upper chamber 202 may be automated and controlled by the controller 124 or the control module 800. In some embodiment, the control module may control the access handle 226, so that facilities are disconnected at the control of the control module 800.

In one embodiment, the control module 800 may include a processor, memory and one or more interfaces. The control module 800 may be employed to control devices in the system in accordance with predefined programming and based in part on sensed values, including any of the aforementioned components of a cluster tool system, including without limitation, an EFEM, a load lock, a post-processing module, a wafer transport module, a wafer orienter, and a process module. It should be appreciated that the control module 800 may control any type of operation for which a given component is defined or capable of performance, in accordance with implementations of the disclosure.

For example only, the control module 800 may control one or more of valves 802, actuators 804, pumps 806, RF generators 822, and other devices 808 based on the sensed values, predefined programming/instructions and other control parameters. The control module 800 receives the sensed values from, for example only, pressure manometers 810, flow meters 812, temperature sensors 814, and/or other sensors 816.

With respect to a given process module, the control module 800 may also be employed to control process conditions during reactant/precursor delivery and plasma processing. The control module 800 will typically include one or more memory devices and one or more processors.

The control module 800 may control activities of the reactant/precursor delivery system and plasma processing apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during processing include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A process module, comprising:
   a chamber body that includes a lower chamber and an upper chamber, the lower chamber is configured to mate with the upper chamber along a diagonal interface;
   an electrode assembly having a substrate support, the electrode assembly is coupled to the upper chamber;
   a hinge connect coupling a first side of the lower chamber to a first side of the upper chamber, the upper chamber is configured to split along the diagonal interface and rotate about the hinge connect, and the electrode assembly is configured to rotate with the upper chamber in a direction that is away from the lower chamber; and
   an electrode connect assembly being connectable and removable from an adjustable gap interface that is coupled to a front side of the upper chamber, the adjustable gap interface is configured to rotate with the upper chamber when the electrode connect assembly is removed.

2. The process module of claim 1, wherein a set of kinematic pins are disposed between the upper chamber and lower chamber on a contact surface of the diagonal interface.

3. The process module of claim 2, wherein the set of kinematic pins provide for repeatable alignment between the upper chamber and the lower chamber.

4. The process module of claim 1, further comprising,
   an upper enclosure is disposed over the upper chamber, the upper enclosure includes an upper electrode, a showerhead and a gas distribution plate, the upper electrode is disposed opposite the substrate support;
   wherein a process region is disposed between the upper electrode and the substrate support.

5. The process module of claim 4, wherein the upper enclosure rotates with the upper chamber along with the electrode assembly, wherein said rotation of the upper chamber exposes an inside region of the lower chamber for servicing.

6. The process module of claim 5, wherein a liner is disposed within said lower chamber, and said servicing includes one of removing or cleaning the liner or said inside region.

7. The process module of claim 1, wherein the hinge connect coupling the first side of the lower chamber to the first side of the upper chamber includes at least two pivot hinges, each pivot hinge enabling the rotation of the upper chamber away from the diagonal interface, and each pivot hinge including a hinge pin.

8. The process module of claim 7, wherein after said rotation of the of the upper chamber away from the diagonal interface, said hinge pin of one of the pivot hinges is removed to enable a second rotation of the upper chamber away from the lower chamber, wherein said second rotation is pivoted about the pivot hinge having the hinge pin still disposed in the pivot hinge, and the pivot hinge having the hinge pin removed separates to enable the second rotation.

9. The process module of claim 8, wherein said second rotation is a left open rotation or a right open rotation, wherein the left open rotation maintains the hinge pin on a right one of the pivot hinge, and the right open rotation maintains the hinge pin on a left one of the pivot hinge.

10. The process module of claim 1, wherein the electrode connect assembly includes a radio frequency (RF) match that connects to an RF transmission rod of the electrode assembly.

11. The process module of claim 1, wherein the electrode connect assembly includes a bulkhead facilities interface that connects a radio frequency (RF) match and facilities to the electrode assembly.

12. The process module of claim 11, wherein an access handle of the electrode connect assembly facilitates engagement and disengagement of the bulkhead facilities interface between the adjustable gap interface and the electrode connect assembly, wherein removal of the electrode connect assembly enables said separation and rotation of the upper chamber from the diagonal interface of the lower chamber.

13. The process module of claim 1, wherein the hinge connect coupling the first side of the lower chamber to the first side of the upper chamber is located at a lower region of the lower chamber for enabling rotation of the upper chamber clock-wise, or is located at an upper region of the lower chamber for enabling rotation of the upper chamber counter clock-wise.

\* \* \* \* \*